United States Patent
Larikka

(10) Patent No.: US 6,388,907 B2
(45) Date of Patent: May 14, 2002

(54) ARRANGEMENT IN FREQUENCY CONVERTER

(75) Inventor: Longinos Larikka, Sundom (FI)

(73) Assignee: Vacon Oyj, Vaasa (FI)

( * ) Notice: Subject to any disclaimer, the term of this patent is extended or adjusted under 35 U.S.C. 154(b) by 0 days.

(21) Appl. No.: 09/828,797

(22) Filed: Apr. 10, 2001

(30) Foreign Application Priority Data

Apr. 28, 2000 (FI) .............................................. 20001004

(51) Int. Cl.⁷ ................................................ H02M 5/00
(52) U.S. Cl. ..................................................... 363/157
(58) Field of Search ................................ 363/144, 146, 363/157; 361/601, 807, 810, 829

(56) References Cited

U.S. PATENT DOCUMENTS

| | | |
|---|---|---|
| 4,685,034 A * | 8/1987 | Tetsu et al. ................. 361/424 |
| 5,497,289 A | 3/1996 | Sugishima et al. |
| 5,610,493 A | 3/1997 | Wieloch |
| 5,617,307 A | 4/1997 | Guigueno |
| 5,666,268 A | 9/1997 | Rix et al. |
| 6,271,603 B1 * | 8/2001 | Kajita ......................... 307/43 |

* cited by examiner

Primary Examiner—Matthew Nguyen
(74) Attorney, Agent, or Firm—Oliff & Berridge, PLC

(57) ABSTRACT

The present invention relates to an arrangement in a frequency converter whose substantial part is an embedding frame (4). The frequency converter (1) is mounted in a set of casings, in which a cover part (7) of at least one casing comprises an opening (8), in which is arranged the embedding frame (4) comprising a frame part (4A) connected to the cover part (7) of the embedding frame (4) and a substantially enclosed tub-like recess (4B) that substantially protrudes inside the casing from the frame part (4A), whereby the control part (3) of the frequency converter (1) is arranged in the recess (4B) of the embedding frame (4).

5 Claims, 3 Drawing Sheets

ARRANGEMENT IN FREQUENCY CONVERTER

FIELD OF THE INVENTION

The invention relates to an arrangement in a frequency converter.

BACKGROUND OF THE INVENTION

A frequency converter is a device by which rotation rate of an AC motor, such as a squirrel-cage motor, is adjusted steplessly. The rotation rate adjustment is carried out in the frequency converter mainly by changing the voltage supplied to the motor and the voltage frequency. The frequency converter allows to adjust acceleration and deceleration, as well as slowing down and reversing of the motor. When the frequency converter is used for controlling the motor, it is possible to perform the adjustment and control of the motor by a computer in a control unit.

A problem with the current frequency converters is that a frequency converter applicable to the control of a motor of a specific size is a compact device, in which all the structural parts of the frequency converter are arranged mutually integrated in one and the same casing. The frequency converter mainly comprises a power part, which consists of means for converting alternating current to direct current and back to alternating current with adjustable frequency, and a control and adjustment part, which consists of means for controlling and adjusting the operation of the power part and thus the operation of an electric motor. In the prior art solution, only the display and the control panel of the frequency converter are placed in the casing cover of the frequency converter and connected with a cable to a control and adjustment part inside the casing.

The frequency converter that is designed and assembled to be compact in this manner has disadvantages, because it is problematic to provide both electromagnetic protection and shielding from contact for the power part and the control and adjustment part that are located mutually integrated in the same casing. It is known that power electronics of the power part produce large amounts of interfering electromagnetic radiance, which is harmful to the operation of the electronics in the control and adjustment part. Secondly, in an integrated solution of this kind it is particularly important to pay attention to the shielding of high voltage components of the power part from contact, so that the safety requirements of the frequency converter can be fulfilled. In addition, the frequency converter technology develops towards modular structure solutions, in which the power part and the control and adjustment part are divided into separate components. Complicated shielding solutions having a large number of separate parts are, in general, uneconomical.

BRIEF DESCRIPTION OF THE INVENTION

The object of the present invention is to reduce disadvantages of the prior art and to provide a novel solution to arrange a control part of a frequency converter in a casing of the frequency converter.

This is achieved with a frequency converter having the characteristics defined in the claims of the present invention. To put it precisely, the frequency converter according to the present invention is mainly characterized by what is disclosed in the characterizing part of claim 1.

The preferred embodiments of the invention are disclosed in the dependent claims.

The invention is based on the idea that a power part and a control and adjustment part of a frequency converter are separated from one another to be separate modules and arranged in a set of casings consisting of one or more casings. At least one casing of the set of casings comprises an openable cover part, in which the control and adjustment part of the frequency converter is arranged. This cover part comprises an opening, in which is arranged an embedding frame comprising a frame part that connects the frame part to the cover part and a substantially enclosed tub-like recess that substantially protrudes inside the casing from the frame part, whereby the control part of the frequency converter is arranged in the tub-like recess of the embedding frame.

Because the structural parts of the frequency converter are divided into two separate units and separated from one another with the embedding frame, a considerable advantage is achieved that the embedding frame constitutes a structure that protects the control and adjustment unit in a variety of ways and simplifies the structure of the frequency converter regarding installation and maintenance, which improves the cost-effectiveness of the frequency converter. This enables maintenance and handling of the control and adjustment part without opening the whole casing cover of the frequency converter, i.e. the control and adjustment part mounted in the embedding frame is readily accessible, as if it were placed outside the casing, but still, it is physically within the external dimensions of the casing.

On the other hand, if the circuits of the power part of the frequency converter need to be accessed for maintenance or handling, the control and adjustment part, when mounted in the openable cover part of the casing and the embedding frame arranged therein, allows free access to the main circuits when the cover part is opened, whereby accessability and serviceability of the power part of the frequency converter implemented by this solution are improved, and consequently, the cost-effectiveness is improved.

A cover part that closes tightly the recess of the embedding frame is arranged on the embedding frame. This has an advantage that the embedding frame and the cover part form a structure around the control and adjustment part, which is located in the recess of the embedding frame, that provides protection against humidity, dust, gas and the like environmental factors, which structure can be sealed to comply with the necessary IP protection class standard.

The embedding frame is made of an electromagnetically protective material, such as metal, whereby the embedding frame forms a structure around the control and adjustment part, which is located in the recess, that advantageously provides protection against electromagnetic radiation and reduces electromagnetic disturbances that the power part causes to the control and adjustment part.

The recess of the embedding frame is designed and formed such that the control and adjustment part mounted in the embedding frame is substantially in the tub-like recess of the embedding frame, whereby the embedding frame provides a mechanically protective structure for the control and adjustment part in the recess. Thus the control and adjustment part is provided with effective, mechanical protection inside the casing, and on the other hand, it is electrically isolated from the power part.

Further, the embedding frame is arranged to provide shielding against contact between the control and adjustment part in the recess and the power part in the set of casings. This improves work safety in mounting situations, because the high-voltage components of the frequency converter can be effectively shielded against contact by encapsulation of the power part and the control and adjustment part implemented by the embedding frame.

BRIEF DESCRIPTION OF THE DRAWINGS

In the following the invention will be described in greater detail by means of the attached drawings, wherein.

DETAILED DESCRIPTION OF THE INVENTION

An example of a structure of a typical arrangement in a frequency converter according to the invention is described with reference to FIGS. 1 to 5.

The frequency converter 1 typically comprises a power part 2, which consists of means for converting alternating current to direct current and back to alternating current whose frequency and voltage are arranged to be adjustable, and a control and adjustment part 3, which consists of means for controlling and adjusting the operation of the power part 2. The frequency converter 1 controls the operation of an electric motor, i.e. typically of a squirrel-cage motor. Control signals provided by the control and adjustment part 3 of the frequency converter 1 to the power part 2 have an indirect effect on the operation of the electric motor to be controlled by the frequency converter 1.

Figure 1:
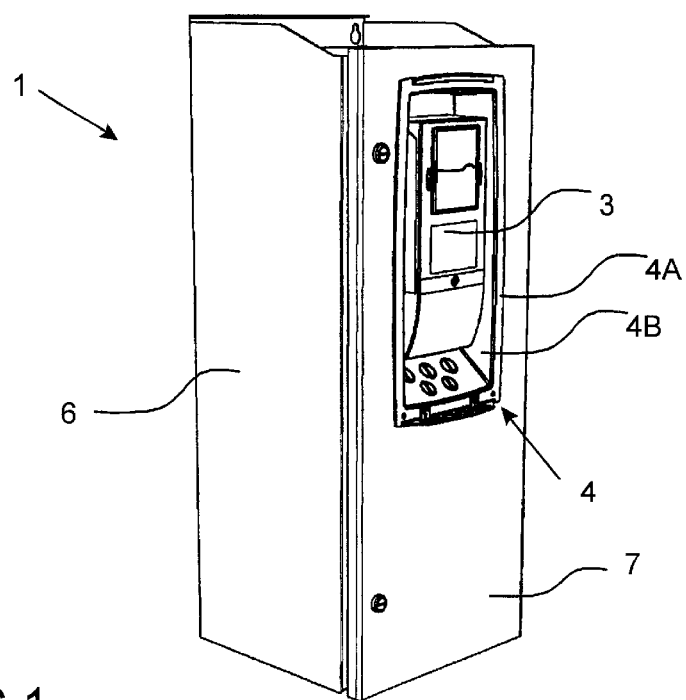
FIG. 1 is an axonometric view of a frequency converter, in which a control and adjustment part is arranged in an embedding frame.
Figure 2:
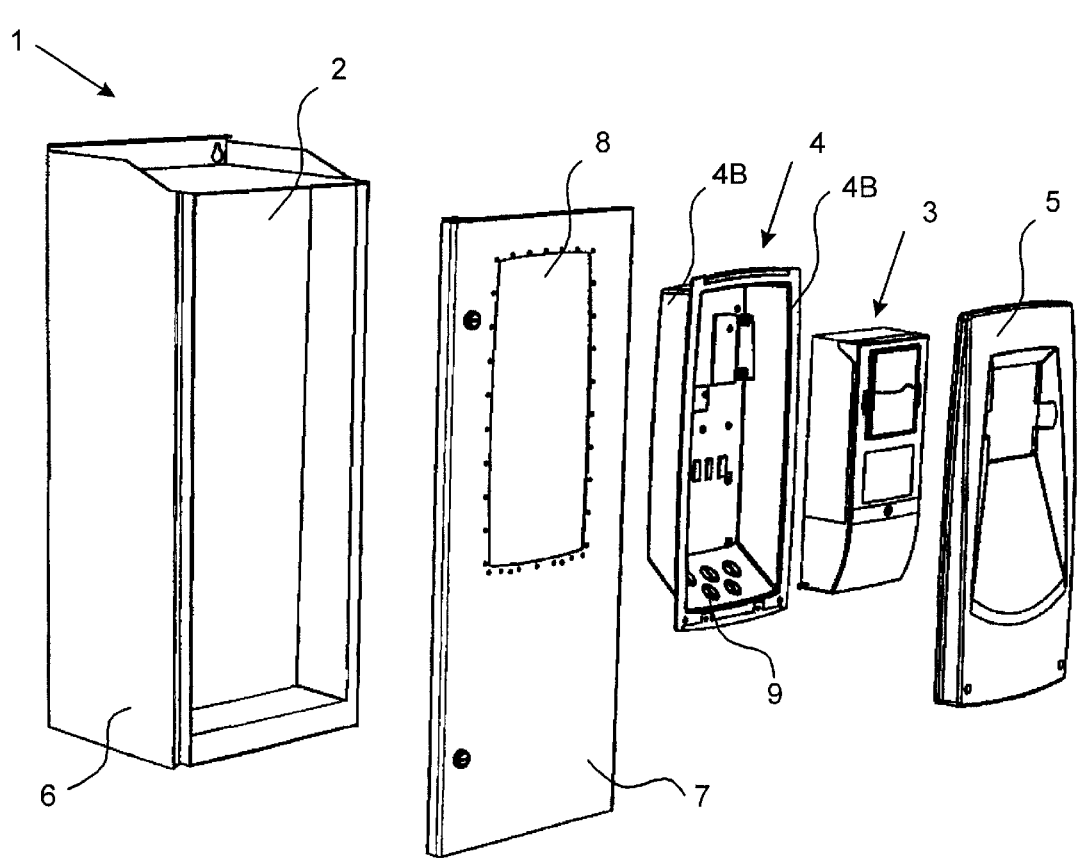
FIG. 2 is an exploded view of the frequency converter of FIG. 1, which shows a modular structure of the frequency converter and the embedding frame as a part thereof.
Figure 3:
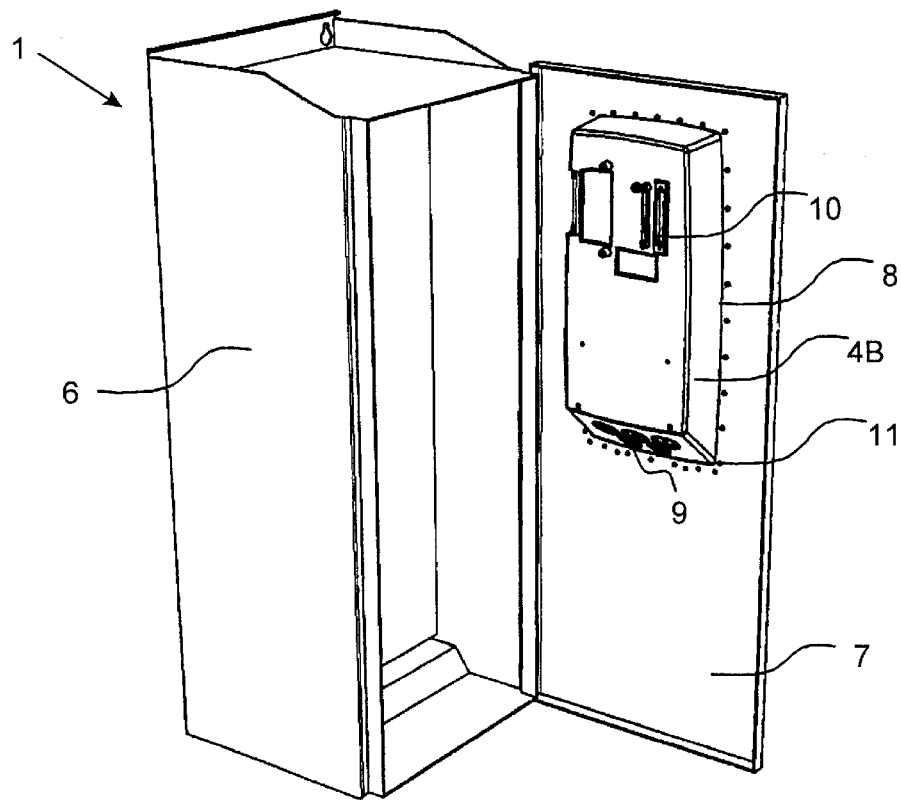
FIG. 3 shows the frequency converter of FIG. 1 in which a cover of a set of casings is open and the embedding frame arranged in the cover is seen from behind.

FIGS. 2 and 3 show an embodiment of the frequency converter 1, in which the power part 2 and the control and adjustment part 3 are separated from one another. The frequency converter is arranged in a casing 6 and an opening 8 is provided in a cover 7 of the casing 6. An embedding frame 4, in which the control and adjustment part 3 is mounted, is arranged in the opening 8.

Figure 4:
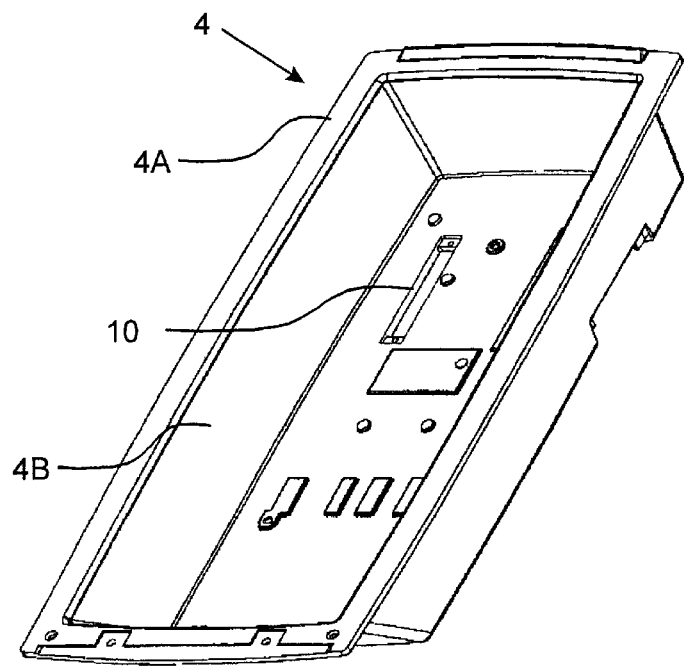
FIG. 4 is an oblique side view of the embedding frame.
Figure 5:
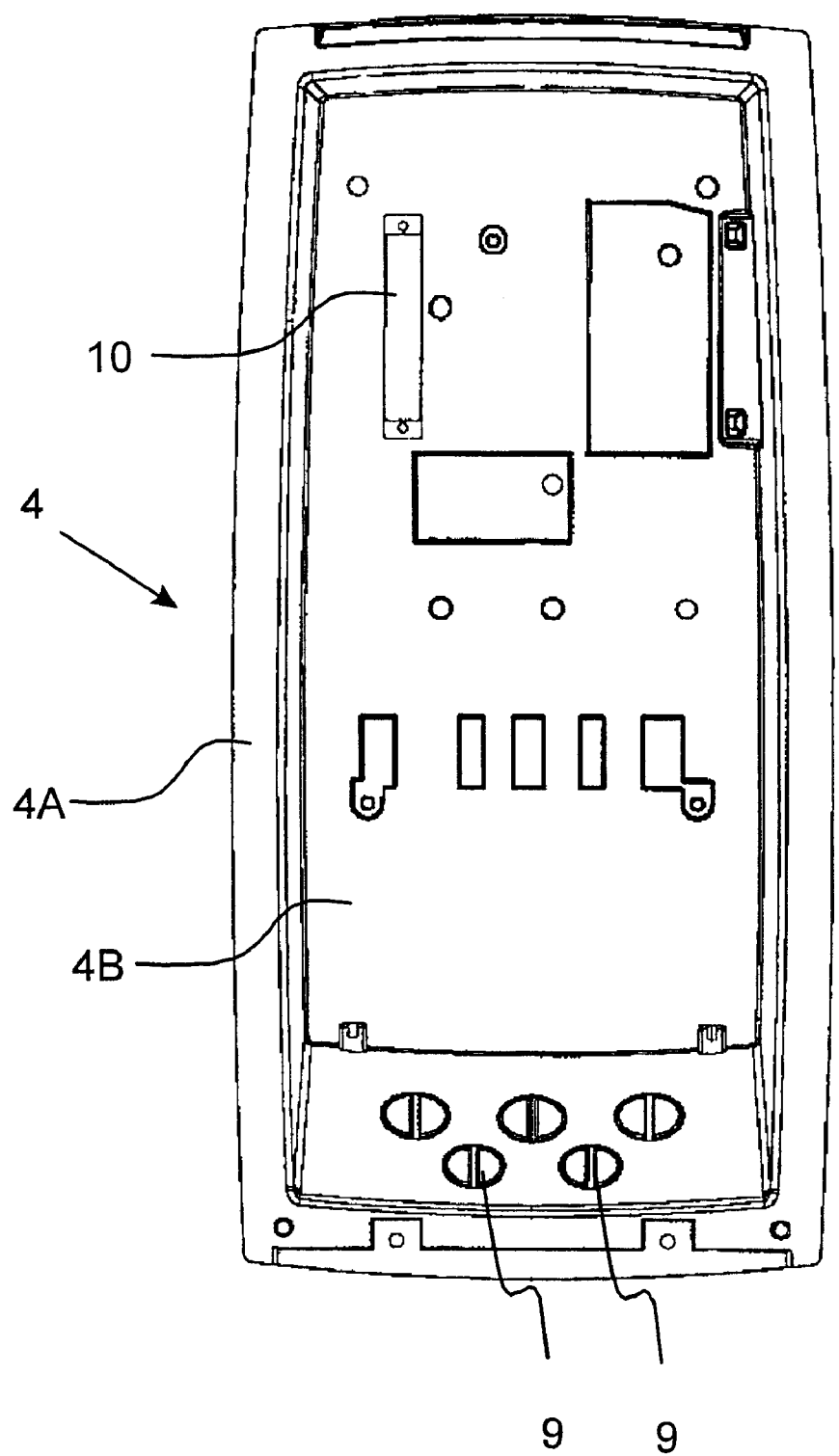
FIG. 5 is a front view of the embedding frame of FIG. 4.

FIGS. 2, 4 and 5 show the structure of the embedding frame 4. The main components of the embedding frame 4 include a frame 4A and a tub-like recess 4B. The embedding frame 4 also comprises through holes 9 for control signal cables, a connector 10 for connecting the control and adjustment part to the power part 2 and securing means 11, by which the embedding frame 4 is secured to the cover 7 of the casing 6. The control signal cables can be applied from the embedding frame 4 to the casing 6 via the through holes 9. An alternative way that is useful in minor frequency converters is to apply the control signal cables from the control and adjustment part 3 on the outer surface of the casing 6 and the cover 7 of the casing.

The tub-like recess 4B of the embedding frame 4 is designed and formed so deep and following the form of the control and adjustment part 3 that the control and adjustment part 3 mounted in the tub-like recess 4B of the embedding frame 4 is substantially in the tub-like recess of the embedding frame 4. Thus, the embedding frame 4 forms a structure that mechanically protects the control and adjustment part 3 located in the recess 4B. The control and adjustment part 3 is then provided with effective mechanical protection inside the casing, for instance, against mechanical stresses in the lateral direction of the casing 6.

The embedding frame 4 is made of an electromagnetically protective material, such as metal. The embedding frame 4 forms a structure around the control and adjustment part 3, which is located in the recess 4B, that provides protection against electromagnetic radiation. The embedding frame 4 thus reduces electromagnetic interference caused by the power part 2 to the control and adjustment part 3. If electromagnetic radiation is not considered to be a problem to a particular embodiment, the embedding frame can also be made of plastic or a similar material.

If necessary, it is also possible to place a cover 5 on the embedding frame 4, which cover protects the control and adjustment part 3 against stresses caused by ambient humidity, dust, gases and other ambient factors. By modifying the sealing of the embedding frame 4 and the cover 5, it is possible to regulate the sealing category.

The electric components of the frequency converter 1 are divided into two separate units and separated from one another by the embedding frame 4. As the embedding frame 4 is arranged in the cover part 7 in the casing 6 of the frequency converter 1, access is provided to maintain and handle the control and adjustment part 3 of the frequency converter 1 without opening the whole cover 7 in the casing 6 of the frequency converter 1. By using the embedding frame 4 it is possible to concentrate the control devices of the frequency converter 1 in the cover part 7 of the frequency converter casing 6. In other words, the control and adjustment part 3 mounted in the embedding frame 4 is readily accessible, as if it were placed outside the casing 6, but still, it is at least mainly within the external dimensions of the casing 6 physically.

The embedding frame 4 placed in the cover 7 of the casing 6 provides shielding against contact between the control and adjustment part 3 in the recess 4B of the embedding frame 4 and the power part 2 in the casing 6. This improves work safety in mounting situations, because the high-voltage components of the frequency converter 1 can be effectively shielded against contact by encapsulation of the power part 2 and the control and adjustment part 3 implemented by the embedding frame 1.

On the other hand, if the circuits of the power part 2 of the frequency converter 1 need to be accessed for maintenance or handling, the control and adjustment part 3, when mounted in the openable cover part 7 of the casing 6 and the embedding frame 4 arranged therein, allows free access to the main circuits when the cover part 7 is opened. This facilitates accessability and serviceability of the power part 2 of the frequency converter 1, and the safety of maintenance measures is improved.

The arrangement in the frequency converter 1 according to the invention, which arrangement comprises an embedding frame 4 as a substantial part, can be used both for protecting the control and adjustment part of the frequency converter arranged in an individual casing and in connection with frequency converters installed in large equipment wholes. In large equipments the control and adjustment part of the frequency converter can be installed at a long distance from the power part, and the equipments may comprise a plurality of frequency converters whose control and adjustment parts are installed in one place in a centralized manner. In that case the embedding frame can be installed in the cover or door of the equipment cabinet in the corresponding manner as described above, whereby the corresponding advantages are achieved by the use of the embedding frame.

It should be understood that the above description and the drawings related thereto are only intended to illustrate the present invention. The invention is not restricted only to the above-described embodiment or that defined in the claims, but it is obvious to the persons skilled in the art that the invention can be varied and modified in a variety of ways within the inventive idea disclosed in the accompanying claims.

What is claimed is:

1. An arrangement in a frequency converter comprising
a frequency converter comprising a power part, which consists of means for converting alternating current to direct current and back to alternating current, whose voltage and frequency are arranged adjustable, and a control and adjustment part, which consists of means for controlling and adjusting the operation of the power part, the power part and the control and adjustment part being separated from one another to form separate modules and arranged in a set of casings consisting of one or more casings, in which at least one casing comprises an openable cover part, the power part and the control part of the frequency converter being arranged in said set of casings, wherein
the cover part of at least one casing of the set of casings comprises an opening, in which is arranged an embedding frame which comprises a frame part connecting the embedding frame to the cover part and a substantially enclosed tub-like recess that substantially protrudes inside the casing from the frame part, whereby the control part of the frequency converter is arranged in the recess of the embedding frame.

2. An arrangement in the frequency converter as claimed in claim 1, wherein a cover part which closes tightly the tub-like recess of the embedding frame is arranged on the embedding frame, whereby the embedding frame and the cover part are arranged to form a structure around the control and adjustment part in the recess that provides protection against humidity, dust, gas or a similar ambient factor.

3. An arrangement in the frequency converter as claimed in claim 1, wherein the embedding frame is made of an electromagnetically protective material, whereby the embedding frame is arranged to form a structure around the control and adjustment part in the recess that provides protection against electromagnetic radiation.

4. An arrangement in the frequency converter as claimed in claim 1, wherein the recess of the embedding frame is designed such that the control and adjustment part arranged in the embedding frame is substantially in the tub-like recess of the embedding frame, whereby the embedding frame is arranged to form a mechanically protective structure for the control and adjustment part in the recess.

5. An arrangement in the frequency converter as claimed in claim 1, wherein the embedding frame is arranged to provide shielding against contact between the control and adjustment part in the recess and the power part in the set of casings.

* * * * *